(12) United States Patent
Huang et al.

(10) Patent No.: US 11,110,415 B2
(45) Date of Patent: Sep. 7, 2021

(54) POLYMER SURFACE WITH T-SHAPED MICROSTRUCTURE AND FABRICATION METHOD THEREFOR AND APPLICATIONS THEREOF

(71) Applicant: SOUTH CHINA UNIVERSITY OF TECHNOLOGY, Guangzhou (CN)

(72) Inventors: Hanxiong Huang, Guangzhou (CN); Anfu Chen, Guangzhou (CN)

(73) Assignee: SOUTH CHINA UNIVERSITY OF TECHNOLOGY, Guangzhou (CN)

(*) Notice: Subject to any disclaimer, the term of this patent is extended or adjusted under 35 U.S.C. 154(b) by 547 days.

(21) Appl. No.: 15/763,161

(22) PCT Filed: Sep. 25, 2016

(86) PCT No.: PCT/CN2016/100032
§ 371 (c)(1),
(2) Date: Mar. 26, 2018

(87) PCT Pub. No.: WO2017/050289
PCT Pub. Date: Mar. 30, 2017

(65) Prior Publication Data
US 2018/0280904 A1 Oct. 4, 2018

(30) Foreign Application Priority Data
Sep. 25, 2015 (CN) .......................... 201510623594.6

(51) Int. Cl.
*B01F 13/00* (2006.01)
*B29C 45/44* (2006.01)
(Continued)

(52) U.S. Cl.
CPC ...... *B01F 13/0072* (2013.01); *B01F 13/0071* (2013.01); *B29C 45/263* (2013.01);
(Continued)

(58) Field of Classification Search
CPC .......................... B01F 13/0072; B01F 13/0071
See application file for complete search history.

(56) References Cited

FOREIGN PATENT DOCUMENTS

| CN | 102427083 | 4/2012 |
|----|-----------|--------|
| CN | 103101147 | 5/2013 |

(Continued)

OTHER PUBLICATIONS

Translation of CN 104002474.*
(Continued)

*Primary Examiner* — Nahida Sultana
*Assistant Examiner* — Asha A Thomas
(74) *Attorney, Agent, or Firm* — JMB Davis Ben-David (57) ABSTRACT

The present invention discloses polymer surfaces with T-shaped microstructure and their fabrication method and applications. The polymer surfaces with the T-shaped microstructure are characterized in that T-shaped microposts arrange orderly on them, and nanobulges arrange orderly on the top surfaces of the micronails of the T-shaped microposts. A flexible insert is designed and manufactured according to the geometry of the T-shaped microposts, and nanogrooves are manufactured on the cavity surface of an injection mold according to the geometry of the nanobulges on the top surfaces of the micronails. The flexible insert is mounted on the injection mold cavity. An injection molding machine is used to inject the molten polymer into the injection mold cavity. Then the polymer surfaces with the T-shaped microposts, on the top surfaces of the micronails of which the nanobulges arrange orderly, are molded. The polymer surfaces with the T-shaped microstructure exhibit robust Cassie-Baxter state and moderate surface adhesion to water droplets, and can be used for quantitative collection, lossless transportation or micromixing of microdroplets.

4 Claims, 9 Drawing Sheets

(51) Int. Cl.
   *B29C 45/26*    (2006.01)
   *B81C 1/00*     (2006.01)
   *B81B 1/00*     (2006.01)
   *B81B 7/04*     (2006.01)
   *B29C 43/02*    (2006.01)
   *B29C 45/00*    (2006.01)

(52) U.S. Cl.
   CPC ............ *B29C 45/4478* (2013.01); *B81B 1/00* (2013.01); *B81B 7/04* (2013.01); *B81C 1/00214* (2013.01); *B29C 45/0001* (2013.01); *B29C 45/2602* (2013.01); *B29C 2043/025* (2013.01); *B29K 2995/0094* (2013.01); *B81B 2203/0315* (2013.01); *B81B 2203/0361* (2013.01); *B81B 2207/056* (2013.01); *B81C 2201/034* (2013.01)

(56) References Cited

FOREIGN PATENT DOCUMENTS

| | | |
|---|---|---|
| CN | 103466539 | 12/2013 |
| CN | 103569950 | 2/2014 |
| CN | 104002474 | 8/2014 |
| CN | 105345984 | 2/2016 |
| CN | 205201976 | 5/2016 |

OTHER PUBLICATIONS

Chen et al. "Design of Microstructures on Superhydrophobic Polymeric Surfaces with Tunable Adhesion" ACTA Polymer ICA Sinica, Mar. 2015, 245-251.

\* cited by examiner

POLYMER SURFACE WITH T-SHAPED MICROSTRUCTURE AND FABRICATION METHOD THEREFOR AND APPLICATIONS THEREOF

CROSS-REFERENCE TO RELATED APPLICATIONS

This is the U.S. National Stage of International Application No. PCT/CN2016/100032 filed Sep. 25, 2016, which was published in Chinese under PCT Article 21(2), and which in turn claims the benefit of China Patent Application No. 201510623594.6, filed Sep. 25, 2015.

FIELD OF THE INVENTION

The present invention relates to functional material surfaces, and particularly to polymer surfaces with T-shaped microstructure and their fabrication method and applications.

BACKGROUND OF THE INVENTION

Functional surfaces with "lotus leaf effect" have broad application prospects in new energy technology, green engineering, underwater decontamination, optics, cell culture, microfluidic control, anti-dusting, and so on. Functional surfaces with "petal effect" simultaneously exhibit superhydrophobic and high adhesion behaviors, and thus have broad application prospects in lossless microdroplet transportation, microdroplet sample analysis, and so on. Artificial functional surfaces generally exhibit poorer stability of the Cassie wetting state, and are easily impregnated under external pressure.

Surfaces with T-shaped microstructure exhibit an improved Cassie wetting state stability with a contact angle of above 150° and low adhesion behavior. Whereas moderate adhesion behavior is required on surfaces for quantitative collection and lossless transportation of microdroplets. To moderately improve the adhesion of water droplets on surfaces, nanostructure should be arranged at the top surfaces of the T-shaped microposts. Considering the complex process of available fabrication methods for surfaces with T-shaped microstructure, more facile methods should be developed. However, there is no report about molding T-shaped microstructure on polymer surfaces using injection molding technology. Moreover, there is no report on the applications of surfaces with T-shaped microstructure in quantitative collection and lossless transportation of microdroplets.

BRIEF SUMMARY OF THE INVENTION

An object of the present invention is to overcome the aforementioned shortcomings of the available relevant technologies and to provide polymer surfaces with T-shaped microstructure, which exhibit moderate surface adhesion to water droplets.

Another object of the present invention is to provide a fabrication method for the polymer surfaces with T-shaped microstructure.

One more object of the present invention is to provide applications of the polymer surfaces with T-shaped microstructure.

Said polymer surfaces with the T-shaped microstructure are characterized in that T-shaped microposts arrange orderly on them, and nanobulges arrange orderly on the top surfaces of the micronails of the T-shaped microposts.

The cross-sectional shape of said T-shaped microposts is round, ellipse, polygon, arch, or multi-arc. Said multi-arc is obtained by connecting multi-segment arcs.

As for said T-shaped microposts, the micronails have cross-sectional dimensions of 20~80 µm and heights of 20~80 µm, the microposts have cross-sectional dimensions of 5~35 µm and heights of 20~80 µm, the central distances between two adjacent microposts are 50~100 µm.

Said nanobulges on the top surfaces of the micronails of the T-shaped microposts have cross-sectional shape of polygon or arch and cross-sectional dimensions of 10~900 nm.

Preferably, nanobulges arrange orderly on the bottom surface of said T-shaped microstructure.

Said fabrication method for the polymer surfaces with the T-shaped microstructure comprises the following steps.

(1) A flexible insert is designed and manufactured according to the geometry of the T-shaped microposts on the polymer surfaces. Micropores, which are used to form the T-shaped microposts on the polymer surfaces, arrange orderly in the flexible insert. Nanogrooves are manufactured on the cavity surface of an injection mold according to the geometry of the nanobulges on the top surfaces of the micronails of the T-shaped microposts on the polymer surfaces.

(2) The flexible insert is mounted on the injection mold cavity. The injection mold is heated to a temperature in a range of 60~120° C. An injection molding machine is employed to plasticize and melt the polymer, and then inject the molten polymer into the injection mold cavity. The polymer melt fills the mold cavity as well as the micropores in the flexible insert and the nanogrooves on the injection mold cavity surface.

(3) The polymer melt within the mold cavity is packed and cooled. Then the molded part is taken out of the mold cavity. The microposts can be detached from the insert with slight deformation and without residue during demolding due to its flexibility. Finally, the polymer surfaces with the T-shaped microposts, on the top surfaces of the micronails of which the nanobulges arrange orderly, are molded.

As for the micropores in said step (1), the portion for forming the micronails of the T-shaped microposts has cross-sectional dimensions of 20~80 µm, and the portion for forming the microposts has cross-sectional dimensions of 5~35 µm. The nanogrooves on the injection mold cavity surface have cross-sectional dimensions of 10~900 nm.

In said step (2), the polymer may be polypropylene, polyethylene, polycarbonate, polystyrene, polymethylmethacrylate, cycloolefin copolymer, or polyurethane.

A microdroplet dripping on said polymer surfaces with the T-shaped microstructure exhibits a contact angle of larger than 150° (that is, superhydrophobicity) and a roll-off angle in a range of 0~180°.

Said polymer surfaces with the T-shaped microstructure exhibit moderate surface adhesion to water droplets.

The underlying mechanism for the water droplet adhesion behavior on said polymer surfaces with the T-shaped microstructure can be described as follows. Said polymer surfaces with the T-shaped microstructure exhibit a robust Cassie-Baxter wetting state with superhydrophobicity. Microscale air pockets trapped below the T-shaped microposts can keep water droplets from penetrating into the gap between the T-shaped microposts. The top surfaces of the T-shaped microposts have nanobulges and so are easy to be impregnated, resulting in increased solid-liquid contact areas and so moderate adhesion to water droplets on the surfaces. So, a water droplet with a moderate volume can pin on the tilted polymer surface with the T-shaped microstructure. The droplet rolls off the surface when its volume reaches a specified value because its gravity component overcomes the surface adhesion force. So, quantitative collection and lossless transportation of microdroplets can be realized on said polymer surfaces with the T-shaped microstructure.

Microdroplets are continuously added onto said polymer surface with the T-shaped microstructure tilted at several different angles. The pinned droplets grow in size until they overcome the surface adhesion and roll off the surface under the gravitation effect. The accumulated droplet volumes for rolling off at the several angles are obtained. Through fitting the obtained data with a polynomial, the following equation can be established for the relationship between the critical roll-off angle (y; degree) and accumulated droplet volume (x; μL): $y=ax^2+bx+c$, where a, b, and c are constants obtained by fitting.

Microfluidic devices with said T-shaped microposts arranged on the surface of their micro channels can be employed for quantitative collection, lossless transportation or micromixing of droplets. The mechanism for the micromixing of droplets can be described as follows. Multiple micro channels in a microfluidic device are arranged at different titled angles. Using micropumps, multiple microdroplets with the same volume are jetted into the different micro channels, respectively, at the same rate. According to said established quantitative relationship between the critical roll-off angle and accumulated droplet volume, the droplets in the different micro channels roll down to the end of the channels when they are accumulated into larger droplets with different volumes. Thus, micromixing of the different droplets is completed with different ratios.

Moreover, said polymer surfaces with the T-shaped microposts can be used in anti-dusting, anti-icing, anti-drag, controlled drug release, and so on due to the moderate water adhesion with the robust Cassie-Baxter state.

Compared with the available relevant technologies, the present invention has the following advantages. (1) The polymer surfaces with the T-shaped microstructure can be fabricated continuously and massively using a common processing equipment (injection molding machine). The fabrication procedure is simple and easy to operate. Thus, the present invention is easy to popularize in industry. (2) The polymer surfaces with the T-shaped microstructure exhibit the robust Cassie-Baxter state. That is, the wetting behavior can be maintained under external impact. (3) The polymer surfaces with the T-shaped microstructure provide the moderate water adhesion due to the nanobulges on the top surfaces of the micronails of the T-shaped microposts, and so can be used for quantitative collection of microdroplets. (4) Microfluidic devices with the T-shaped microposts arranged on the surface of their micro channels can be employed for micromixing of the different droplets with different ratios.

BRIEF DESCRIPTION OF THE DRAWINGS

FIGS. 7a and 7b are schematic views of the microfluidic device with the T-shaped microposts arranged on the surface of its micro channels according to embodiment 1 of the present invention, in which FIG. 7a is front view and FIG. 7b is side view.

DETAILED DESCRIPTION OF THE INVENTION

The invention will be described in more detail with the aid of the embodiments and the accompanying drawings, but the mode for carrying out the invention is not limited to what described as follows.

Embodiment 1

Figure 1A:
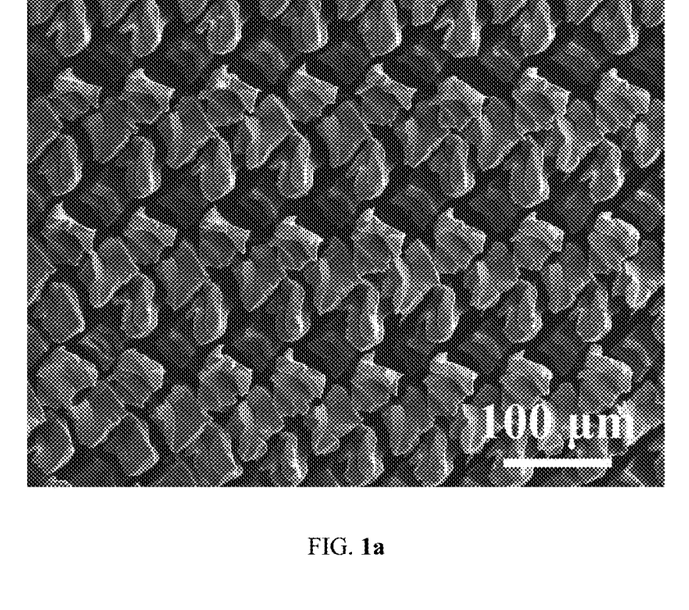
FIG. 1a is an SEM micrograph of the polymer surface with the T-shaped microstructure according to embodiment 1 of the present invention.
Figure 1B:
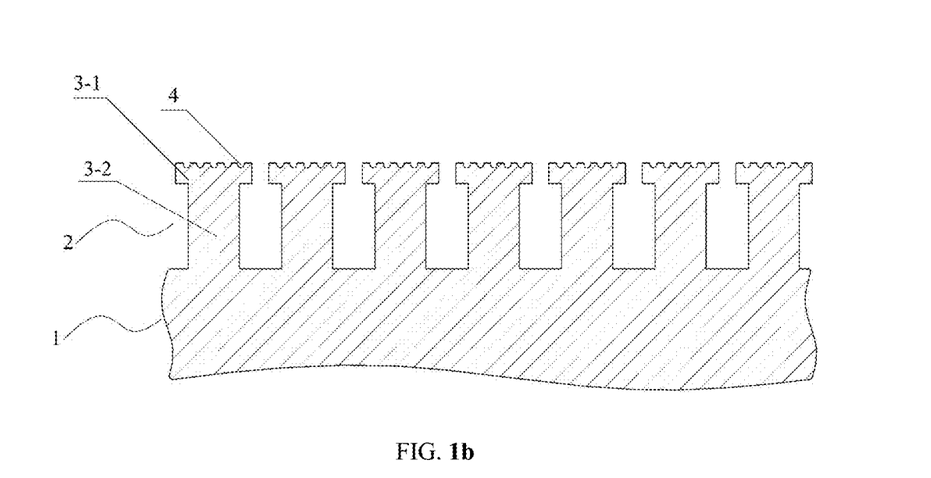
FIG. 1b is a schematic view of various embodiments of the T-shaped micropost arrays according to the present invention.

The present embodiment discloses a polymer surface 1 with T-shaped microstructure. With reference to FIG. 1, T-shaped microposts 2 arrange orderly on the polymer surface 1 with the T-shaped microstructure. Nanobulges 4 arrange orderly on the top surfaces of the micronails 3-1 of the T-shaped microposts 2.

The cross-sectional shape of the T-shaped microposts 2 is rectangle.

As for the T-shaped microposts 2, the micronails 3-1 have a cross-sectional width of 45 μm and height of 12 μm, the microposts 3-2 have a cross-sectional width of 30 μm and height of 70 μm, the central distance between two adjacent T-shaped microposts 2 is 55 μm.

The cross-section of the nanobulges 4 on the top surfaces of the micronails 3-1 is arched and has a dimension of 900 nm.

The fabrication method for the aforesaid polymer surface 1 with the T-shaped microstructure comprises the following steps.

Figure 2:
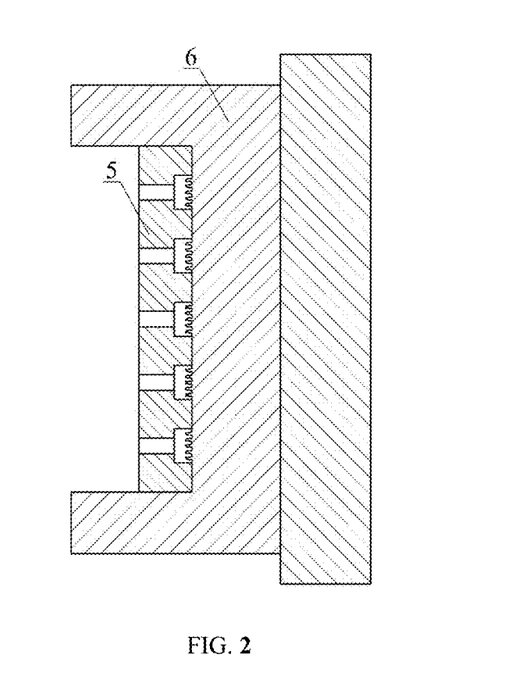
FIG. 2 is a sectional view of various embodiments of the injection mold with the flexible insert mounted on its cavity surface according to the present invention.

(1) Referring to FIG. 2, a flexible insert 5 is designed and manufactured according to the geometry of the T-shaped microposts 2 on the polymer surface. Micropores, which are used to form the T-shaped microposts 2 on the polymer surface, arrange orderly in the flexible insert 5. Nanogrooves are manufactured on the cavity surface of an injection mold 6 according to the geometry of the nanobulges 4 on the top surfaces of the micronails 3-1 of the T-shaped microposts on the polymer surface.

(2) The flexible insert 5 is mounted on the cavity surface of the injection mold 6. The injection mold 6 is heated to a temperature of 120° C. An injection molding machine is employed to plasticize and melt the polymer, and then inject the molten polymer into the cavity of the injection mold 6. The polymer melt fills the cavity of the injection mold 6 as well as the micropores in the flexible insert 5 and the nanogrooves on the cavity surface of the injection mold 6.

(3) The polymer melt within the cavity of the injection mold 6 is packed and cooled. Then the molded part is taken out of the mold 6. The microposts can be detached from the insert 5 with slight deformation and without residue during demolding due to its flexibility. Finally, the polymer surface 1 with the T-shaped microposts 2, on the top surfaces of the micronails 3-1 of which the nanobulges 4 arrange orderly, is molded.

As for the micropores in the flexible insert 5 in said step (1), the portion for forming the micronails 3-1 of the T-shaped microposts 2 has a cross-sectional width of 45 μm, and the portion for forming the microposts 3-2 has a cross-sectional width of 30 μm. The nanogrooves on the cavity surface of the injection mold 6 have a cross-sectional dimension of 900 nm.

In said step (2), the polymer is polypropylene.

Figure 3A:
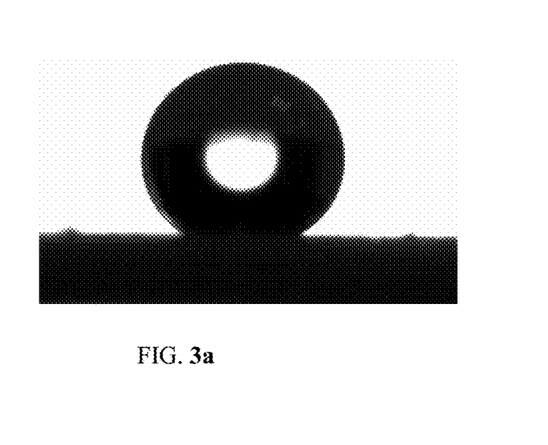
FIGS. 3a and 3b are images of a 4-μL, water droplet on the polymer surface with the T-shaped microstructure when placed horizontally and vertically, respectively, according to embodiment 1 of the present invention.
Figure 3B:
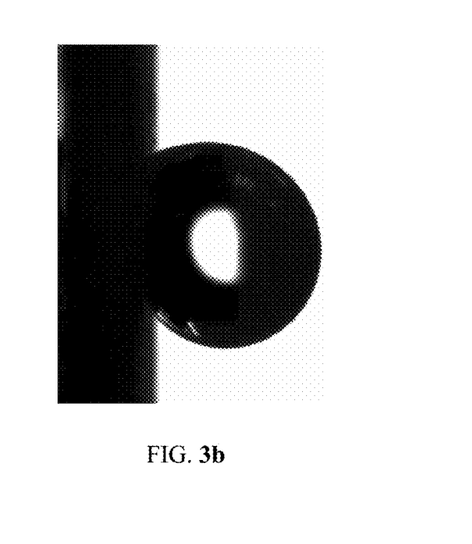

Referring to FIGS. 3a and 3b showing the images of a 4-μL, water droplet on the polypropylene surface 1 with the T-shaped microstructure when placed horizontally and vertically, respectively, the droplet exhibits a contact angle of 151° and a roll-off angle of larger than 90°.

Figure 4:
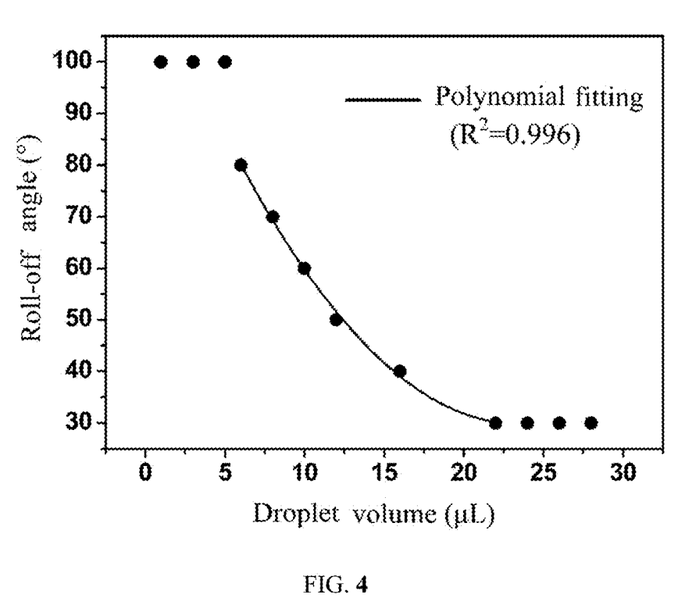
FIG. 4 is a relationship between the critical roll-off angle and accumulated droplet volume for the droplets on the polymer surface with the T-shaped microstructure according to embodiment 1 of the present invention.
Figure 5A:
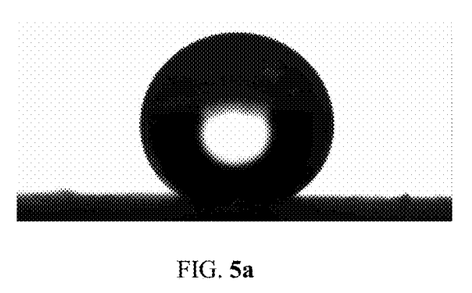
FIG. 5 is typical images of a 4-μL, water droplet (a) before, (b) during, and (c, d) after squeezing it using two polymer surfaces with the T-shaped microstructure according to embodiment 1 of the present invention. Arrows represent moving direction.
Figure 5B:
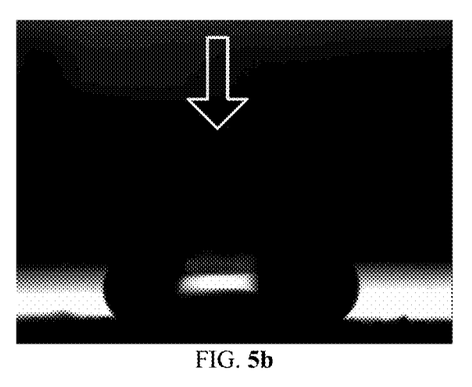
Figure 5C:
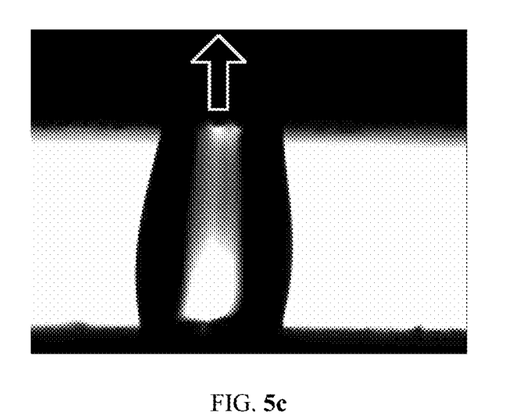
Figure 5D:
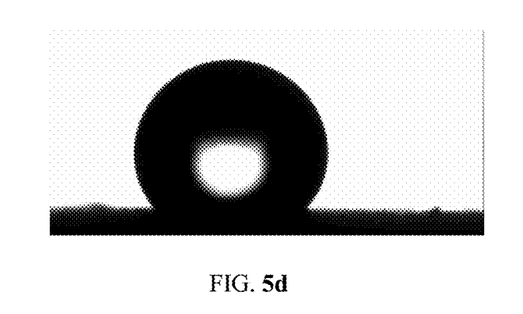
Figure 6A:
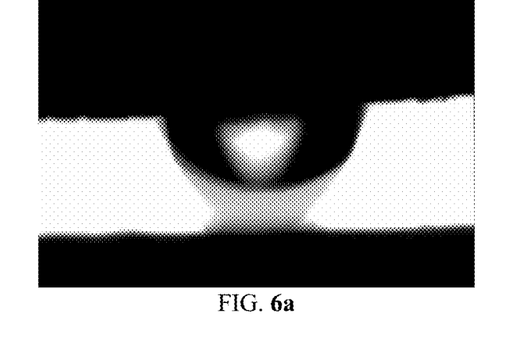
FIG. 6 is typical images of the squeezed and recovered 4-μL, water droplet (displayed in FIG. 5) during transferring according to embodiment 1 of the present invention.
Figure 6B:
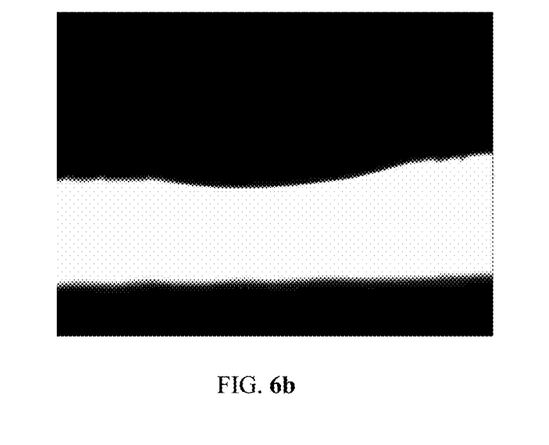

Micro-droplets are continuously added onto the polypropylene surface 1 with the T-shaped microstructure tilted at six different angles (80°, 70°, 60°, 50°, 40°, and 30°). The pinned droplets grow in size until they overcome the surface adhesion and roll off the surface under the gravitation effect. FIG. 4 illustrates the accumulated droplet volumes for rolling off at the six angles. Through fitting the obtained data with a polynomial, the following equation is established for the relationship between the critical roll-off angle (y; degree) and accumulated droplet volume (x; μL): $y=0.17x^2-7.8x+120.9$. The polypropylene surface 1 with the T-shaped microstructure provides a moderate water adhesion, and so can be used for quantitative collection of microdroplets. With reference to FIGS. 5a, 5b, 5c, and 5d, a 4-μL, droplet can still recover its spherical shape after squeezing it using two polypropylene surfaces 1 with the T-shaped microstructure, implying that the polypropylene surface 1 with the T-shaped microstructure can stabilize the Cassie-Baxter state. Further, the aforesaid squeezed and recovered 4-μL droplet is contacted by a filter paper downward. Referring to FIGS. 6a and 6b, the droplet adheres to the filter paper completely and then spreads out instantaneously once they touch each other, indicating that lossless droplet transportation can be achieved on the polypropylene surface 1 with the T-shaped microstructure.

Figure 7A:
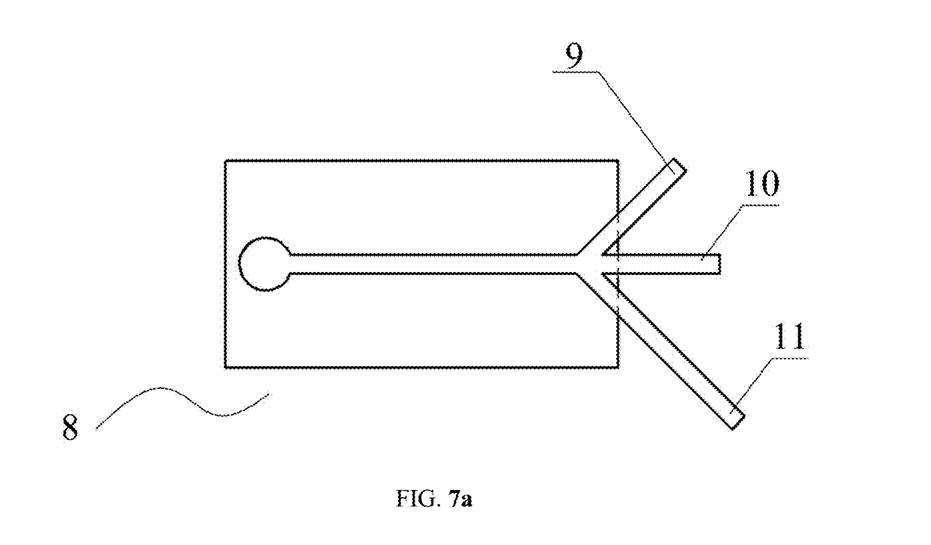
Figure 7B:
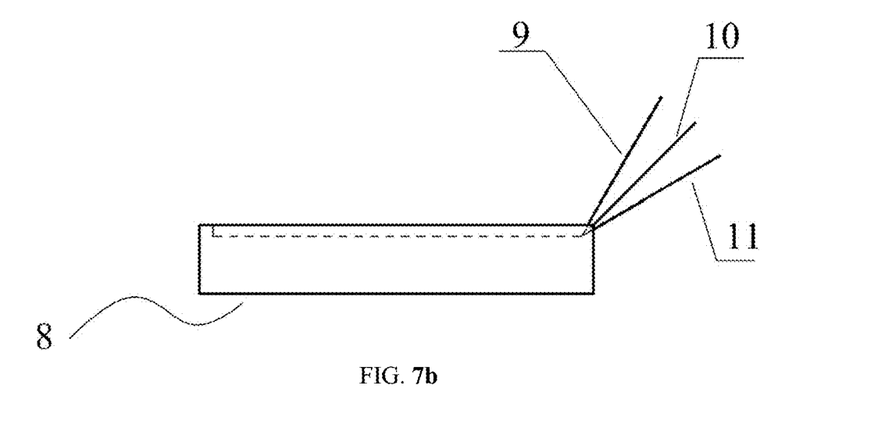

Microfluidic device with the aforesaid T-shaped microposts arranged on the surface of its micro channels can be used for the micromixing of droplets due to the moderate water adhesion. Reference is now made to FIG. 7, in a microfluidic device 8, the micro channel 9 is arranged at 60° titled angle, the micro channel 10 is arranged at 45° titled angle, and the micro channel 11 is arranged at 30° titled angle. The aforesaid T-shaped microposts are arranged on the surfaces of the micro channels 9, 10, and 11. Using micropumps, three microdroplets with the same volume are jetted into the three micro channels, respectively, at the same rate. According to the aforesaid established quantitative relationship between the critical roll-off angle and accumulated droplet volume, the droplets in the three micro channels roll down to the end of the channels when they are accumulated into larger droplets with different volumes. Thus, micromixing of the three droplets is completed with different ratios.

Embodiment 2

The present embodiment discloses a polymer surface 1 with the T-shaped microstructure. Compared with embodiment 1, there are the following differences for embodiment 2.

The cross-sectional shape of the T-shaped microposts 2 is round.

As for the T-shaped microposts 2, the micronails 3-1 have a cross-sectional diameter of 60 μm and height of 30 μm, the microposts 3-2 have a cross-sectional diameter of 15 μm and height of 40 μm, the central distance between two adjacent T-shaped microposts 2 is 90 μm.

The cross-section of the nanobulges 4 on the top surfaces of the micronails 3-1 is trapezoid and has a dimension of 500 nm.

As for the micropores in the flexible insert 5 in said step (1), the portion for forming the micronails 3-1 of the T-shaped microposts 2 has a cross-sectional diameter of 60 μm, and the portion for forming the microposts 3-2 has a cross-sectional diameter of 15 μm. The nanogrooves on the cavity surface of the injection mold 6 have a cross-sectional dimension of 500 nm.

In said step (2), the polymer is polyethylene.

Figure 8:
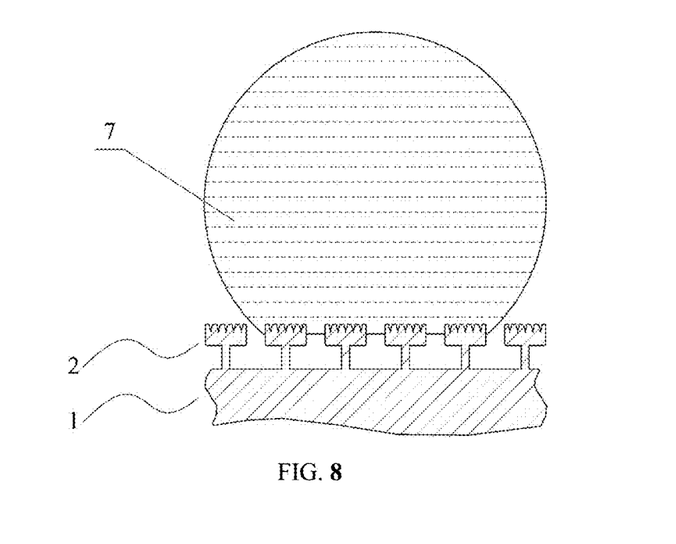
FIG. 8 is a schematic view of the wetting state of a 4-μL water droplet on the polymer surface with the T-shaped microstructure when placed horizontally according to embodiment 2 of the present invention.

Referring to FIG. 8 showing a schematic view of the wetting state of a 4-μL, water droplet 7 on the polyethylene surface 1 with the T-shaped microstructure when placed horizontally, the droplet 7 exhibits a contact angle of 155° and a roll-off angle of larger than 90°.

Figure 9:
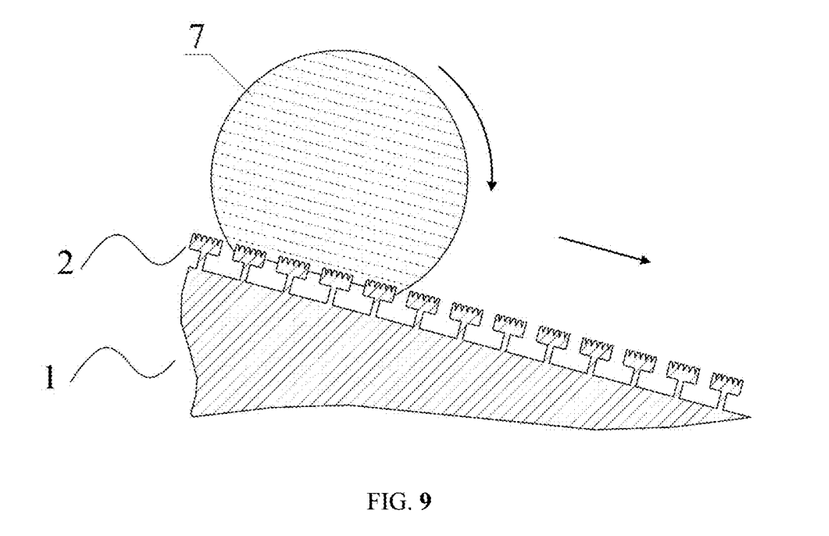
FIG. 9 is a schematic view of rolling-off of a water droplet on the polymer surface with the T-shaped microstructure when placed at 60° titled angle according to embodiment 2 of the present invention.

Referring to FIG. 9 showing a schematic view of rolling-off of a water droplet 7 on the polyethylene surface 1 with the T-shaped microstructure when placed at 60° titled angle, the polyethylene surface 1 with the T-shaped microstructure exhibits a moderate water adhesion and so can be used for quantitative collection of microdroplets.

Embodiment 3

The present embodiment discloses a polymer surface 1 with the T-shaped microstructure. Compared with embodiment 1, there are the following differences for embodiment 3.

The cross-sectional shape of the T-shaped microposts 2 is regular hexagon.

As for the T-shaped microposts 2, the micronails 3-1 have a cross-sectional width of 30 μm and height of 10 μm, the microposts 3-2 have a cross-sectional width of 10 μm and height of 30 μm, the central distance between two adjacent T-shaped microposts 2 is 45 μm.

The cross-section of the nanobulges 4 on the top surfaces of the micronails 3-1 is regular triangle in shape and has a width of 300 nm.

As for the micropores in the flexible insert 5 in said step (1), the portion for forming the micronails 3-1 of the T-shaped microposts 2 has a cross-sectional width of 30 µm, and the portion for forming the microposts 3-2 has a cross-sectional width of 10 µm. The nanogrooves on the cavity surface of the injection mold 6 have a cross-sectional width of 300 nm.

In said step (2), the polymer is polycarbonate.

A 4-µL water droplet on the polycarbonate surface 1 with the T-shaped microstructure exhibits a contact angle of 153° and a roll-off angle of larger than 90°.

Embodiment 4

The present embodiment discloses a polymer surface 1 with the T-shaped microstructure. Compared with embodiment 1, there are the following differences for embodiment 4.

As for the T-shaped microposts 2, the micronails 3-1 have a cross-sectional width of 60 µm and height of 30 µm, the microposts 3-2 have a cross-sectional width of 12 µm and height of 40 µm, the central distance between two adjacent T-shaped microposts 2 is 90 µm.

Figure 10:
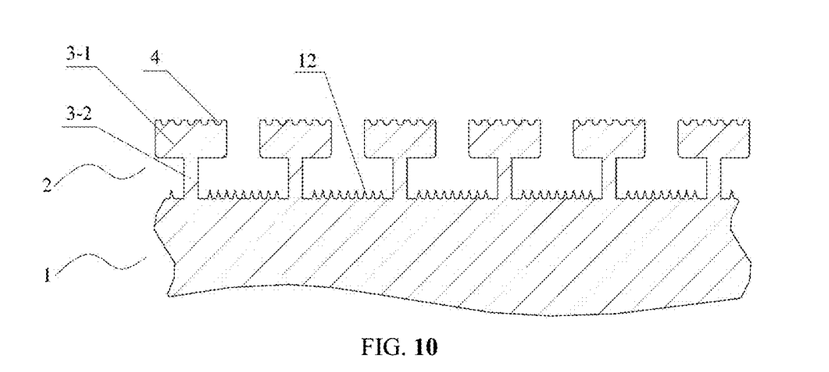
FIG. 10 is a sectional view of the T-shaped micropost arrays according to embodiment 4 of the present invention.

With reference to FIG. 10, nanobulges 12 arrange orderly on the bottom surface of the T-shaped microstructure.

The cross-section of the nanobulges 12 is regular triangle in shape and has a width of 100 nm and depth of 200 nm.

Figure 11:
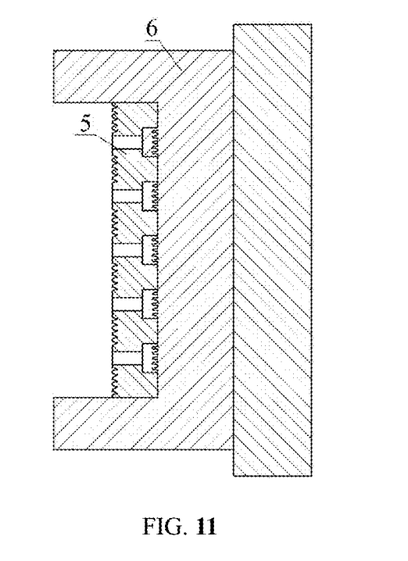
FIG. 11 is a sectional view of the injection mold with the flexible insert mounted on its cavity surface according to embodiment 4 of the present invention.

Reference is now made to FIG. 11, nanogrooves are manufactured on the surface of the flexible insert 5 according to the geometry of the nanobulges 12 on the bottom surface of the T-shaped microstructure.

As for the micropores in the flexible insert 5 in said step (1), the portion for forming the micronails 3-1 of the T-shaped microposts 2 have a cross-sectional width of 60 µm, and the portion for forming the microposts 3-2 has a cross-sectional width of 12 µm.

Figure 12:
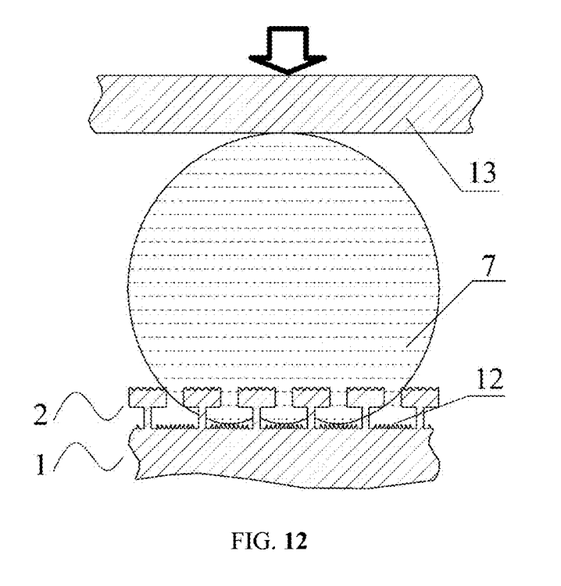
FIG. 12 is a schematic view of the wetting state of a water droplet on the polymer surface with the T-shaped microstructure when the droplet is under external pressure according to embodiment 4 of the present invention.

FIG. 12 shows a schematic view of the wetting state of a water droplet 7 on the polypropylene surface 1 with the T-shaped microstructure when the droplet 7 is under external pressure. As can be seen, when the droplet 7 is squeezed by a slab 13, it may penetrate into the gaps between the T-shaped microposts, but can be kept from impregnating the bottom surface of the T-shaped microstructure thank to the nanobulges 12.

The foregoing description and the drawings are illustrative of the present invention and are not to be taken as limiting. Still other embodiments are also allowed. Still other variants and rearrangements of parts within the spirit and scope of the present invention are possible and will be readily apparent to those skilled in the art.

What is claimed is:

1. A polymer surface comprising a T-shaped microstructure, wherein the T-shaped microstructure comprises T-shaped microposts arranged on the polymer surface an upper portion of the T-shaped microposts comprises micronails and nanobulges arranged on top surfaces of micronails of the T-shaped microposts; wherein the micronails have cross-sectional dimensions of 20-80 µm and heights of 20-80 µm, and the nanobulges have cross-sectional dimensions of 10-900 nm.

2. The polymer surface according to claim 1, wherein the cross-sectional shape of the T-shaped microposts is round, ellipse, polygon, arch, or multi-arc; and the multi-arc is obtained by connecting multi-segment arcs.

3. The polymer surface according to claim 1, wherein the microposts have cross-sectional dimensions of 5-35 µm and heights of 20-80 µm, and the central distances between two adjacent microposts are 50-100 µm.

4. The polymer surface according to claim 1, wherein the nanobulges are on the polymer surface below the T-shaped microstructure.

* * * * *